US011441045B2

(12) United States Patent
Li et al.

(10) Patent No.: US 11,441,045 B2
(45) Date of Patent: Sep. 13, 2022

(54) INK COMPOSITION FOR INKJET PRINTING ORGANIC LIGHT-EMITTING DIODES AND METHOD OF MANUFACTURING THE SAME

(71) Applicant: Shenzhen China Star Optoelectronics Semiconductor Display Technology Co., Ltd., Guangdong (CN)

(72) Inventors: Xianglong Li, Guangdong (CN); Hong Meng, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 350 days.

(21) Appl. No.: 16/649,999

(22) PCT Filed: Dec. 27, 2019

(86) PCT No.: PCT/CN2019/129159
§ 371 (c)(1),
(2) Date: Mar. 24, 2020

(87) PCT Pub. No.: WO2021/120299
PCT Pub. Date: Jun. 24, 2021

(65) Prior Publication Data
US 2021/0179876 A1 Jun. 17, 2021

(30) Foreign Application Priority Data
Dec. 16, 2019 (CN) .......................... 201911296708.5

(51) Int. Cl.
| | |
|---|---|
| C09D 11/00 | (2014.01) |
| C09D 11/38 | (2014.01) |
| C09D 11/36 | (2014.01) |
| H01L 51/00 | (2006.01) |

(52) U.S. Cl.
CPC .............. *C09D 11/38* (2013.01); *C09D 11/36* (2013.01); *H01L 51/0059* (2013.01); *H01L 51/0061* (2013.01); *H01L 51/0062* (2013.01); *H01L 51/0072* (2013.01); *H01L 51/0005* (2013.01)

(58) Field of Classification Search
CPC ............. H01L 51/0059; H01L 51/0061; H01L 51/0072; H01L 51/0005; C09D 11/38; C09D 11/36
USPC ....................................... 106/31.13
See application file for complete search history.

(56) References Cited

U.S. PATENT DOCUMENTS

| | | | |
|---|---|---|---|
| 6,425,948 B1 * | 7/2002 | Nowak ................. | C09D 11/17 106/31.77 |
| 9,359,513 B1 | 6/2016 | Takashima et al. | |
| 2006/0257768 A1 * | 11/2006 | Chen ..................... | G03G 5/064 430/96 |
| 2016/0359128 A1 | 12/2016 | Tsukamoto et al. | |

FOREIGN PATENT DOCUMENTS

| | | | | |
|---|---|---|---|---|
| CN | 104009173 | A | 8/2014 | |
| CN | 105153807 | A | 12/2015 | |
| CN | 105503846 | A | 4/2016 | |
| CN | 105981476 | A | 9/2016 | |
| CN | 106816544 | A | 6/2017 | |
| CN | 106867520 | A | 6/2017 | |
| CN | 106946878 | A | 7/2017 | |
| CN | 106977703 | A | 7/2017 | |
| CN | 107011269 | A | 8/2017 | |
| CN | 107146853 | A | 9/2017 | |
| CN | 110157241 | A * | 8/2019 | ............. C09D 11/03 |

* cited by examiner

*Primary Examiner* — Phuc T Dang
(74) *Attorney, Agent, or Firm* — Mark M. Friedman

(57) ABSTRACT

An ink composition for inkjet printing organic light-emitting diodes and a method of manufacturing the same are disclosed. The ink composition includes 0.01-40% of bipolar light emission component, 10-99.9% of solvent, 0.01-5% of surface tension modifier, and 0.01-5% of viscosity modifier by weight. The method of manufacturing the ink composition includes steps of: dispersing the bipolar light emission component in the solvent firstly, and then adding the viscosity modifier and the surface tension modifier under stirring, so as to obtain the ink composition. By using the ink composition, specific hole and electron transport layers provided in the organic light-emitting diode manufactured by inkjet printing may be omitted, thereby simplifying the structure of the organic light-emitting diode. Moreover, the ink composition has suitable viscosity, surface tension, and volatility.

15 Claims, No Drawings

INK COMPOSITION FOR INKJET PRINTING ORGANIC LIGHT-EMITTING DIODES AND METHOD OF MANUFACTURING THE SAME

FIELD OF INVENTION

The present disclosure relates to an ink composition and a method of manufacturing the same, and in particular, to an ink composition for inkjet printing organic light-emitting diodes and a method of manufacturing the same.

BACKGROUND OF DISCLOSURE

The basic structure of organic light-emitting diodes (OLEDs) includes an anode, an organic functional layer, and a cathode sequentially formed on a substrate. The organic functional layer mainly includes a hole injection layer, a hole transport layer, a light-emitting layer, an electron transport layer, and an electron injection layer sequentially disposed on the anode. When the power source provides an adequate voltage, holes in the anode and electric charges in the cathode are combined in the light-emitting layer to emit light. According to the different compositions, three primary colors of a red color, a green color and a blue color are generated in order to form base colors.

The method of manufacturing the OLEDs includes an evaporation deposition method and a solution method. The mainly principle of the evaporation deposition is thermal evaporation of organic materials. That is, the organic materials are heated under vacuum. Depending on the characteristics of the materials, some of the materials are liquefied and then gasified while some of the materials are sublimated directly. Then, the materials diffuse outward at a certain initial rate, move to the surface of indium tin oxide film, and are deposited by cooling to form a thin film. The solution method includes an inkjet printing method, in which materials with desired functions are sprayed on a substrate by a print head. Compared with the evaporation deposition method, the solution method has many advantages such as high material utilization rates, simple device manufacturing, large-area processing, fine masks omitting, and low costs, thereby attracting the science and industry fields greatly.

OLEDs manufactured by the inkjet printing method usually also requires a hole injection layer, a hole transport layer, a light-emitting layer, and an electron transport layer. The multiple functional layers cannot be soluble in each other. Moreover, the multiple functional layers must have the excellent combination performance, thereby increasing the difficulty of ink development in the inkjet printing method. In addition, the simplification of the structure of the OLEDs is the current development goal. The key point for simplifying the structure of the OLEDs is the ink preparation. In other words, the development progress of the ink will directly determine the development of simplifying the structure of the OLEDs.

Technical Problems

An object of the present disclosure is to provide an ink composition for inkjet printing organic light-emitting diodes and a method of manufacturing the same, by which specific hole and electron transport layers provided in the organic light-emitting diode manufactured by inkjet printing may be omitted, thereby simplifying the structure of the organic light-emitting diode.

SUMMARY OF INVENTION

Technical Solutions

In order to achieve the above object of the present disclosure, an embodiment of the present disclosure provides an ink composition for inkjet printing organic light-emitting diodes, comprising: 20% of bipolar light emission component, 70% of solvent, 2% of surface tension modifier, and 2% of viscosity modifier by weight.

In one embodiment of the present disclosure, the bipolar light emission component is single-component light emission material selected from a group consisting of fluorescence material, phosphorescence material, thermally activated delayed fluorescence material, room temperature phosphorescence material, aggregation-induced delayed fluorescence material, free radical material, quantum dot material, excimer material, and exciplex material.

In one embodiment of the present disclosure, the bipolar light emission component is multi-component light emission material and comprises light emission material and host material, wherein the light emission material is selected from a group consisting of fluorescent material, phosphorescence material, thermally activated delayed fluorescence material, room temperature phosphorescence material, aggregation-induced delayed fluorescence material, free radical material, quantum dot material, excimer material, and exciplex material, and the host material is selected from single-component bipolar host material or multi-component bipolar host material.

In one embodiment of the present disclosure, the single-component bipolar host material is selected from a group consisting of CBP, 26DczPPy, and 35DczPPy, and the multi-component bipolar host material is selected from a group consisting of TCTA/26DczPPy, mCP/B3PyMPM, PVK/OXD-7, TCTA/B3PyMPM, m-MTDATA/OXD-7, and NPB/PO-T2T.

In one embodiment of the present disclosure, the solvent includes one of alkane hydrocarbon compound, aromatic hydrocarbon compound, alcohol compound, and high boiling point solvent.

In one embodiment of the present disclosure, the high boiling point solvent is selected from a group consisting of ether compound, ester compound, and aromatic compound.

In one embodiment of the present disclosure, the surface tension modifier is selected from one or more of a group consisting of cosolvent and surfactant.

In one embodiment of the present disclosure, the surface tension modifier is selected from one or more of a group consisting of imidazole and a derivative thereof, phenol, and hydroquinone.

In one embodiment of the present disclosure, the viscosity modifier is selected from one or more of a group consisting of alcohol, ether, ester, phenol, and amine.

In order to achieve the above object of the present disclosure, another embodiment of the present disclosure provides an ink composition for inkjet printing organic light-emitting diodes, comprising: 0.01-40% of bipolar light emission component, 10-99.9% of solvent, 0.01-5% of surface tension modifier, and 0.01-5% of viscosity modifier by weight.

In one embodiment of the present disclosure, the bipolar light emission component is single-component light emission material selected from a group consisting of fluorescence material, phosphorescence material, thermally activated delayed fluorescence material, room temperature phosphorescence material, aggregation-induced delayed fluorescence material, free radical material, quantum dot material, excimer material, and exciplex material.

In one embodiment of the present disclosure, the bipolar light emission component is multi-component light emission material and comprises light emission material and host material, wherein the light emission material is selected from a group consisting of fluorescent material, phosphorescence material, thermally activated delayed fluorescence material, room temperature phosphorescence material, aggregation-induced delayed fluorescence material, free radical material, quantum dot material, excimer material, and exciplex material, and the host material is selected from single-component bipolar host material or multi-component bipolar host material.

In one embodiment of the present disclosure, the single-component bipolar host material is selected from a group consisting of CBP, 26DczPPy, and 35DczPPy, and the multi-component bipolar host material is selected from a group consisting of TCTA/26DczPPy, mCP/B3PyMPM, PVK/OXD-7, TCTA/B3PyMPM, m-MTDATA/OXD-7, and NPB/PO-T2T.

In one embodiment of the present disclosure, the solvent includes one of alkane hydrocarbon compound, aromatic hydrocarbon compound, alcohol compound, and high boiling point solvent.

In one embodiment of the present disclosure, the high boiling point solvent is selected from a group consisting of ether compound, ester compound, and aromatic compound.

In one embodiment of the present disclosure, the surface tension modifier is selected from one or more of a group consisting of cosolvent and surfactant.

In one embodiment of the present disclosure, the surface tension modifier is selected from one or more of a group consisting of imidazole and a derivative thereof, phenol, and hydroquinone.

In one embodiment of the present disclosure, the viscosity modifier is selected from one or more of a group consisting of alcohol, ether, ester, phenol, and amine.

Furthermore, another embodiment of the present disclosure provides a method of manufacturing the ink composition mentioned above, wherein the method includes the steps of: dispersing the bipolar light emission component in the solvent to obtain a pre-formed composition; and adding the viscosity modifier and the surface tension modifier into the pre-formed composition under stirring to obtain the ink composition.

Beneficial Effects

Compared with the prior art, by utilizing the bipolar light emission component, its combination with other components and the specific ratio therebetween in the ink composition of the present disclosure, specific hole and electron transport layers provided in the organic light-emitting diode manufactured by inkjet printing may be omitted, thereby simplifying the structure of the organic light-emitting diode.

DETAILED DESCRIPTION OF EMBODIMENTS

It should be understood that the specific embodiments described herein are only used to explain the present disclosure, rather than limit the present disclosure.

An ink composition for inkjet printing organic light-emitting diodes according to an embodiment of the present disclosure, comprising: 0.01-40% of bipolar light emission component, 10-99.9% of solvent, 0.01-5% of surface tension modifier, and 0.01-5% of viscosity modifier by weight. The content of each component in the ink composition of the present disclosure is not limited thereto. In other embodiments, the content of the plurality of components may be different. For example, the content of the bipolar light emission component is 5-30%, 10-20%, or 20-30% by weight; the content of the solvent is 20-80%, 30-70%, or 40-60%; the content of the surface tension modifier is 0.1-1%, 1-4%, 2-3%, or 2.5-3%; and the content of the viscosity modifiers 0.1-1%, 1-4%, 2-3%, or 2.5-3%.

Specifically, the bipolar light emission component is used to realize the adjustment of the light color of light emission in different wavelength bands, the balance of the bipolar charge carriers, and the adjustment of the light emission efficiency. The bipolar light emission component may be single-component light emission material, or mixture material with bipolar characteristics mixed by multiple materials. Specifically, the bipolar light emission component which is single-component light emission material may be selected from a group consisting of fluorescence material, phosphorescence material, thermally activated delayed fluorescence material, room temperature phosphorescence material, aggregation-induced delayed fluorescence material, free radical material, quantum dot material, excimer material, and an exciplex material. The bipolar light emission component which is multi-component light emission material may comprise light emission material and host material. The light emission material is selected from a group consisting of fluorescent material, phosphorescence material, thermally activated delayed fluorescence material, room temperature phosphorescence material, aggregation-induced delayed fluorescence material, free radical material, quantum dot material, excimer material, and exciplex material. The host material is selected from single-component bipolar host material or multi-component bipolar host material. Specifically, the single-component bipolar host material is selected from a group consisting of CBP, 26DczPPy, and 35DczPPy. The multi-component bipolar host material is selected from a group consisting of the electron transport materials and the hole transport materials, such as TCTA/26DczPPy, mCP/B3PyMPM, PVK/OXD-7, TCTA/B3PyMPM, m-MTDATA/OXD-7, and NPB/PO-T2T.

The solvent may be organic solvent or inorganic solvent, which is used to dissolve and disperse the bipolar light emission component while adjusting the physical properties of the solution to meet the requirements of solution processing. The solvent includes alkane hydrocarbon compound, aromatic hydrocarbon compound, alcohol compound, and high boiling point solvent. Specifically, in the present embodiment, the alcohol compound may be monohydric alcohol or polyalcohol. The high boiling point of the high boiling point solvent means the temperature greater than 160° C. The high boiling point solvent can be selected from a group consisting of ether compound, ester compound, and aromatic compound.

The surface tension modifier is used to adjust the surface tension to meet the requirements of inkjet printing. The desired range of the surface tension modifier is 25-40 mN/m. The surface tension modifier is selected from one or more of a group consisting of a cosolvent and surfactant. Specifically, the surface tension modifier is selected from one or more of a group consisting of imidazole and a derivative thereof, phenol, and hydroquinone.

The viscosity modifier is used to adjust the viscosity to meet the requirements of inkjet printing. The desired range of the viscosity modifier is 3-12 cP. The viscosity modifier is selected from one or more of a group consisting of alcohol, ether, ester, phenol and amine.

A method of manufacturing an ink composition for inkjet printing organic light-emitting diode according to an embodiment of the present disclosure is used for manufacturing the above ink composition, including steps of: dispersing the bipolar light emission component in the solvent to obtain a pre-formed composition, and adding the viscosity modifier and the surface tension modifier into the pre-formed composition under stirring to obtain the ink composition.

Specifically, in the present embodiment, about 20 wt % of the bipolar light emission component is dispersed firstly in 70 wt % of the solvent to obtain a pre-formed composition. Then, 2 wt % of the viscosity modifier and 2 wt % of the surface tension modifier are added into the pre-formed composition under stirring to obtain an ink composition.

As mentioned above, by utilizing the bipolar light emission component, its combination with other components, and the specific ratio therebetween in the ink composition of the present disclosure, specific hole and electron transport layers provided in the organic light-emitting diode manufactured by inkjet printing may be omitted, thereby simplifying the structure of the organic light-emitting diode.

As used herein, the singular form "a", "an" and "the" include plural references unless the context clearly dictates otherwise. For example, the term "a compound" or "at least one compound" may include a plurality of compounds, including mixtures thereof.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

It should be noted that the "%" mentioned above in the present disclosure refers to "weight percentage (wt %)" unless there is specific description herein otherwise, and the numerical range (e.g. 10% to 15% of A) contains the upper and lower limits (ie. $10\% \leq A \leq 15\%$) and all numerical points in the range (e.g. 11, 12, 13, 14, . . . ) unless there is specific description herein otherwise. If the lower limit is not defined in the numerical range (e.g. less than or below 0.2% of B), it means that the lower limit may be 0 (ie. $0\% \leq B \leq 0.2\%$).

The present disclosure has been illustrated by the above related embodiments, but the above embodiments are used as examples for implementing the present disclosure. It must be noted that the disclosed embodiments do not limit the scope of the invention. On the contrary, modifications and equivalent arrangements included within the spirit and scope of the appended claims are all included in the scope of the present disclosure.

What is claimed is:

1. An ink composition for inkjet printing organic light-emitting diodes, comprising: 20% of bipolar light emission component, 70% of solvent, 2% of surface tension modifier, and 2% of viscosity modifier by weight,
wherein the bipolar light emission component is single-component light emission material selected from a group consisting of fluorescence material, phosphorescence material, thermally activated delayed fluorescence material, room temperature phosphorescence material, aggregation-induced delayed fluorescence material, free radical material, quantum dot material, excimer material, and exciplex material; or
the bipolar light emission component is multi-component light emission material and comprises light emission material and host material, wherein the light emission material is selected from a group consisting of fluorescent material, phosphorescence material, thermally activated delayed fluorescence material, room temperature phosphorescence material, aggregation-induced delayed fluorescence material, free radical material, quantum dot material, excimer material, and exciplex material, and the host material is selected from single-component bipolar host material or multi-component bipolar host material.

2. The ink composition of claim 1, wherein the single-component bipolar host material is selected from a group consisting of CBP, 26DczPPy, and 35DczPPy, and the multi-component bipolar host material is selected from a group consisting of TCTA/26DczPPY, mCP/B3PyMPM, PVK/OXD-7, TCTA/B3PyMPM, m-MTDATA/OXD-7, and NPB/PO-T2T.

3. The ink composition of claim 1, wherein the solvent includes one of alkane hydrocarbon compound, aromatic hydrocarbon compound, alcohol compound, and high boiling point solvent.

4. The ink composition of claim 3, wherein the high boiling point solvent is selected from a group consisting of ether compound, ester compound, and aromatic compound.

5. The ink composition of claim 1, wherein the surface tension modifier is selected from one or more of a group consisting of cosolvent and surfactant.

6. The ink composition of claim 1, wherein the surface tension modifier is selected from one or more of a group consisting of imidazole and a derivative thereof, phenol, and hydroquinone.

7. The ink composition of claim 1, wherein the viscosity modifier is selected from one or more of a group consisting of alcohol, ether, ester, phenol, and amine.

8. An ink composition for inkjet printing organic light-emitting diodes, comprising: 0.01-40% of bipolar light emission component, 10-99.9% of solvent, 0.01-5% of surface tension modifier, and 0.01-5% of viscosity modifier by weight,
wherein the bipolar light emission component is single-component light emission material selected from a group consisting of fluorescence material, phosphorescence material, thermally activated delayed fluorescence material, room temperature phosphorescence material, aggregation-induced delayed fluorescence material, free radical material, quantum dot material, excimer material, and exciplex material; or
the bipolar light emission component is multi-component light emission material and comprises light emission material and host material, wherein the light emission material is selected from a group consisting of fluorescent material, phosphorescence material, thermally activated delayed fluorescence material, room temperature phosphorescence material, aggregation-induced delayed fluorescence material, free radical material, quantum dot material, excimer material, and exciplex material, and the host material is selected from single-component bipolar host material or multi-component bipolar host material.

9. The ink composition of claim 8, wherein the single-component bipolar host material is selected from a group consisting of CBP, 26DczPPy, and 35DczPPy, and the multi-component bipolar host material is selected from a group consisting of TCTA/26DczPPY, mCP/B3PyMPM, PVK/OXD-7, TCTA/B3PyMPM, m-MTDATA/OXD-7, and NPB/PO-T2T.

10. The ink composition of claim 8, wherein the solvent includes one of alkane hydrocarbon compound, aromatic hydrocarbon compound, alcohol compound, and high boiling point solvent.

11. The ink composition of claim 10, wherein the high boiling point solvent is selected from a group consisting of ether compound, ester compound, and aromatic compound.

12. The ink composition of claim 8, wherein the surface tension modifier is selected from one or more of a group consisting of cosolvent and surfactant.

13. The ink composition of claim 8, wherein the surface tension modifier is selected from one or more of a group consisting of imidazole and a derivative thereof, phenol, and hydroquinone.

14. The ink composition of claim 8, wherein the viscosity modifier is selected from one or more of a group consisting of alcohol, ether, ester, phenol, and amine.

15. A method of manufacturing the ink composition for inkjet printing organic light-emitting diode according to any one of claim 8, comprising steps of:
    dispersing the bipolar light emission component in the solvent to obtain a pre-formed composition; and
    adding the viscosity modifier and the surface tension modifier into the pre-formed composition under stirring to obtain the ink composition.

\* \* \* \* \*